US009797593B2

(12) United States Patent
Dinh et al.

(10) Patent No.: US 9,797,593 B2
(45) Date of Patent: Oct. 24, 2017

(54) APPARATUS AND METHOD FOR VAPOR GENERATION AND FILM DEPOSITION

(71) Applicant: MSP Corporation, Shoreview, MN (US)

(72) Inventors: Thuc M. Dinh, Shakopee, MN (US); Yamin Ma, Roseville, MN (US); Benjamin Y. H. Liu, North Oaks, MN (US)

(73) Assignee: MSP Corporation, Shoreview, MN (US)

(*) Notice: Subject to any disclaimer, the term of this patent is extended or adjusted under 35 U.S.C. 154(b) by 0 days.

(21) Appl. No.: 14/709,055

(22) Filed: May 11, 2015

(65) Prior Publication Data
US 2016/0334099 A1 Nov. 17, 2016

(51) Int. Cl.
F22B 29/06 (2006.01)
F22B 1/28 (2006.01)
C23C 16/448 (2006.01)
F01K 5/00 (2006.01)

(52) U.S. Cl.
CPC .......... F22B 1/282 (2013.01); C23C 16/4486 (2013.01); F01K 5/00 (2013.01)

(58) Field of Classification Search
CPC .................................................. C23C 16/00
USPC ..... 392/324, 328; 427/248.1, 255.23, 255.26
See application file for complete search history.

(56) References Cited

U.S. PATENT DOCUMENTS

| 6,409,839 B1* | 6/2002 | Sun ................. C23C 16/448 118/726 |
| 7,695,700 B2* | 4/2010 | Holst ................. B01D 47/06 423/210 |
| 2001/0049906 A1* | 12/2001 | Shimazu ............ B01B 1/005 48/76 |
| 2005/0147749 A1* | 7/2005 | Liu ................. C23C 16/4486 427/248.1 |
| 2006/0169201 A1* | 8/2006 | Hwang ............ C23C 16/4486 118/300 |
| 2007/0082485 A1* | 4/2007 | Chiang ................ B82Y 30/00 438/665 |
| 2008/0264443 A1* | 10/2008 | Shrinivasan .......... B08B 7/0021 134/2 |
| 2009/0065066 A1* | 3/2009 | Ono ................. C23C 16/4486 137/13 |

(Continued)

Primary Examiner — Dana Ross
Assistant Examiner — Joseph Iskra
(74) Attorney, Agent, or Firm — Westman, Champlin & Koehler, P.A.; Z. Peter Sawicki; Amanda M. Prose

(57) ABSTRACT

An apparatus and method for generating a vapor with a compact vaporizer design and exposing the gas and liquid mixture for vaporization to a reduced maximum temperature. A gas and liquid droplet flow through a metal housing configured to heat the gas and liquid droplet mixture flow for vaporization includes directing the gas and liquid droplet mixture through an inlet of the metal housing and flowing the gas through a tortious flow path defined by a plurality of tubular flow passageways arranged around a central axis for vaporization. Residual liquid droplets may be further vaporized by flowing through a second metal housing configured to heat the gas and liquid droplet mixture for vaporization and having a similar construction to the first metal housing and providing a second tortious flow path.

15 Claims, 3 Drawing Sheets

(56) References Cited

U.S. PATENT DOCUMENTS

2010/0065972 A1* 3/2010 Liu ..................... B05B 7/1686
　　　　　　　　　　　　　　　　　　　　　261/128
2011/0192909 A1* 8/2011 Liu ..................... B05B 17/04
　　　　　　　　　　　　　　　　　　　　　239/4

* cited by examiner

APPARATUS AND METHOD FOR VAPOR GENERATION AND FILM DEPOSITION

BACKGROUND

The process of creating a vapor from a liquid can be accomplished by heating the liquid to a sufficiently high temperature to cause the liquid to undergo a phase change and become a vapor. To generate vapor at a sufficiently high rate, it is necessary to supply an adequate amount of heating energy to the liquid in a relatively short time. This can be accomplished by increasing the operating temperature of the vapor generating apparatus or providing a larger heat transfer surface so that heat can be conducted more easily into the liquid.

In semiconductor applications, a wide variety of precursor chemicals are available in liquid form for vapor generation and for subsequent thin film deposition on a substrate by a vapor phase process. Processes such as chemical vapor deposition (CVD), plasma-enhanced chemical vapor deposition (PECVDP), metal-organic CVD (MOCVD), atmosphere pressure chemical vapor deposition (APCVD) and atomic layer deposition (ALD) are well known to those skilled in the art of semiconductor device fabrication. Some precursor chemicals such as metal-organic compounds can decompose at high temperatures to form undesirable by-products to cause process or equipment contamination. For such applications, the heating temperature must be kept low to avoid thermal decomposition and by-product formation. Increasing the heat transfer surface area will generally cause the overall physical size of the apparatus to increase, thus making the device less responsive to changing vapor demands in the process. The response speed of the apparatus will thus decrease. As a result, the traditional approach to increasing vaporization rate is not suitable for all applications.

SUMMARY

The present disclosure is directed to a method of vapor generation that allows for a more compact vaporizer design, while reducing the maximum temperature to which the liquid and vapor are exposed to. The method includes flowing a mixture of gas and liquid droplets for vaporization through at least one heat exchanger having a plurality of surfaces for heat transfer to the gas, the increased surface area in the heat exchanger directing the gas and liquid mixture through a tortious flow path to further increase heat transfer and vaporization. The method may further include directing the mixture to a second heat exchanger to further vaporize any remaining liquid droplets in the gas. One or both heat exchangers may be configured with a tortious flow path comprising a plurality of tubular flow passageways.

Another aspect of the present disclosure relates to an apparatus for vaporization of the gas and liquid droplet mixture. The apparatus may be smaller and more compact in size, but able to maintain a high capacity for vaporization of liquid droplets in a gas. An increased heat transfer surface area in the apparatus allows for increased vaporization at a lower maximum temperature of the apparatus. The apparatus incorporates at least one heat exchanger having an increased surface area of heated flow paths for thermal transfer from a heating element to the gas comprising the liquid droplets. The apparatus is configured to vaporize the liquid droplets to form a vapor and comprises at least a first and preferably a second heat exchanger, the first heat exchanger in fluid communication with the second heat exchanger. The first heat exchanger is a primary heat exchanger comprising a housing having an inlet and an outlet allowing a gas carrying suspended liquid droplets to enter and flow through the first heat exchanger. This gas and liquid droplet mixture is flown through the first heat exchanger and the liquid droplets may be vaporized by a tortious flow path, in that the flow direction of the gas alternates in flow direction at least once in the first heat exchanger. The flow path may comprise a plurality of metal tubes within the first heat exchanger.

The primary heat exchanger may then be in fluid communication with a second heat exchanger, also referred to as a secondary heat exchanger. The secondary heat exchanger may have a construction substantially similar to the construction of the first heat exchanger and is configured to receive the gas and liquid mixture having at least some liquid droplets that were not vaporized after the gas and liquid mixture flows through the primary heat exchanger, and to further vaporize the gas and liquid mixture. One or both of the heat exchangers may comprise tubular flow passageways configured to provide a tortious flow path for vaporization.

DEFINITIONS

Unless otherwise specified, the following terms as used herein have the meanings provided below:

The terms "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the present disclosure.

The terms "about" and "substantially" are used herein with respect to measurable values and ranges due to expected variations known to those skilled in the art (e.g., limitations and variabilities in measurements).

DETAILED DESCRIPTION

Figure 1A:
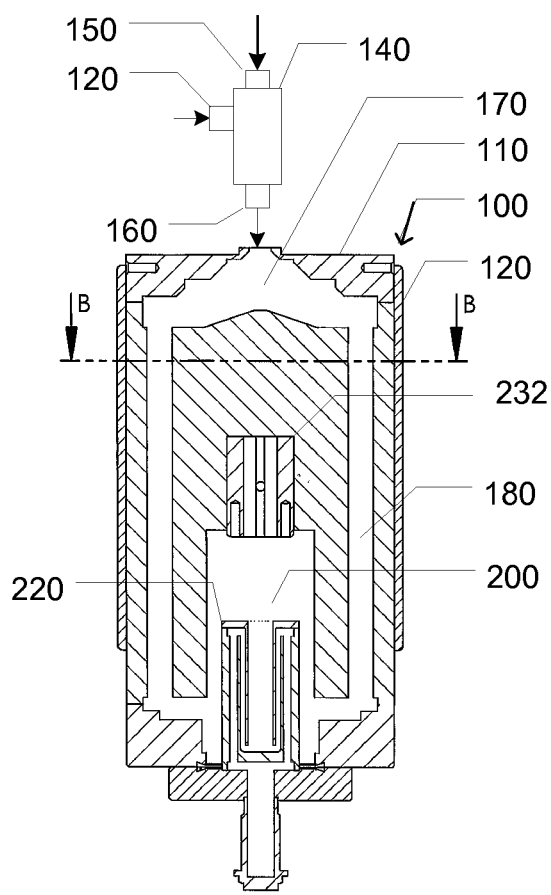
FIG. 1A is a vertical sectional view of a vapor generating apparatus.
Figure 1B:
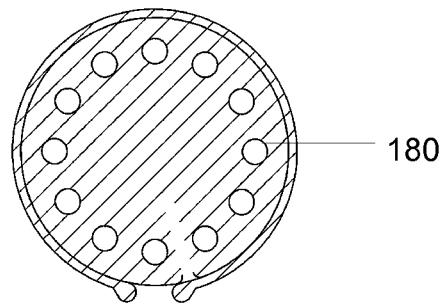
FIG. 1B is a horizontal sectional view along the line B-B of the vapor generating apparatus of the embodiment illustrated in FIG. 1A.

The present disclosure is directed to a vapor generating apparatus. A vertical sectional view of the vapor generating apparatus is illustrated in FIG. 1A, and FIG. 1B is a horizontal sectional view of the same apparatus along line B-B of FIG. 1A. Like reference characters will be used for like elements throughout the figures. FIG. 3B is a sectional view of an embodiment of the vapor generation apparatus along the line C-C in FIG. 3A.

Referring to FIGS. 1A-1B, the vapor generating apparatus is generally illustrated at 100. The apparatus 100 includes a metal housing 110, and an electric heater 120 surrounding the metal housing 110 and in good thermal contact with the metal housing 110. Located above the vapor generating apparatus is an atomizer 140. Liquid to be vaporized is introduced into the liquid inlet 120 of the atomizer 140 along with a carrier gas, which flows into a gas inlet 150 of the atomizer 140, to form a droplet aerosol comprised of small liquid droplets suspended in the carrier gas. The droplet aerosol then flows out of the atomizer 140 through an outlet 160 and into a space 170 in the vapor generating apparatus 100 for heating and vaporization.

Under normal operating conditions, the atomizer 140 is located in a cleanroom. Both the precursor liquid and the carrier gas flowing into the atomizer 140, as well as the droplet aerosol flowing out of the atomizer 140, are both held at substantially the same temperature as the ambient air temperature (generally "room temperature"). The droplet aerosol then flows down a multitude of tubular gas flow passageways. One of the gas flow passage ways is illustrated by circular hole 180 in FIG. 1B. As the aerosol flows down the tubular gas flow passage ways, heat is transferred from heated metal surfaces by convection into the droplet aerosol, causing the suspended droplets in the aerosol to vaporize and form a vapor. The resulting gas/vapor mixture then flows out of the vaporization apparatus through the downstream flow passageways for additional heating and vaporization. The gas flow passageways shown as round holes 180 in FIG. 1B are considered as the first, primary heating stage for droplet vaporization. Any un-vaporized droplets can then be vaporized in a second heating stage described further below.

At high liquid flow rates, droplet vaporization in gas flow passage ways 180 may be incomplete. The droplet aerosol then enters into space 200 and into a metal structure 220 for further heating and vaporization. The metal structure 220 thus becomes a second vaporization stage for the un-vaporized liquid droplets in this two stage heating and vaporization process.

Figure 2:
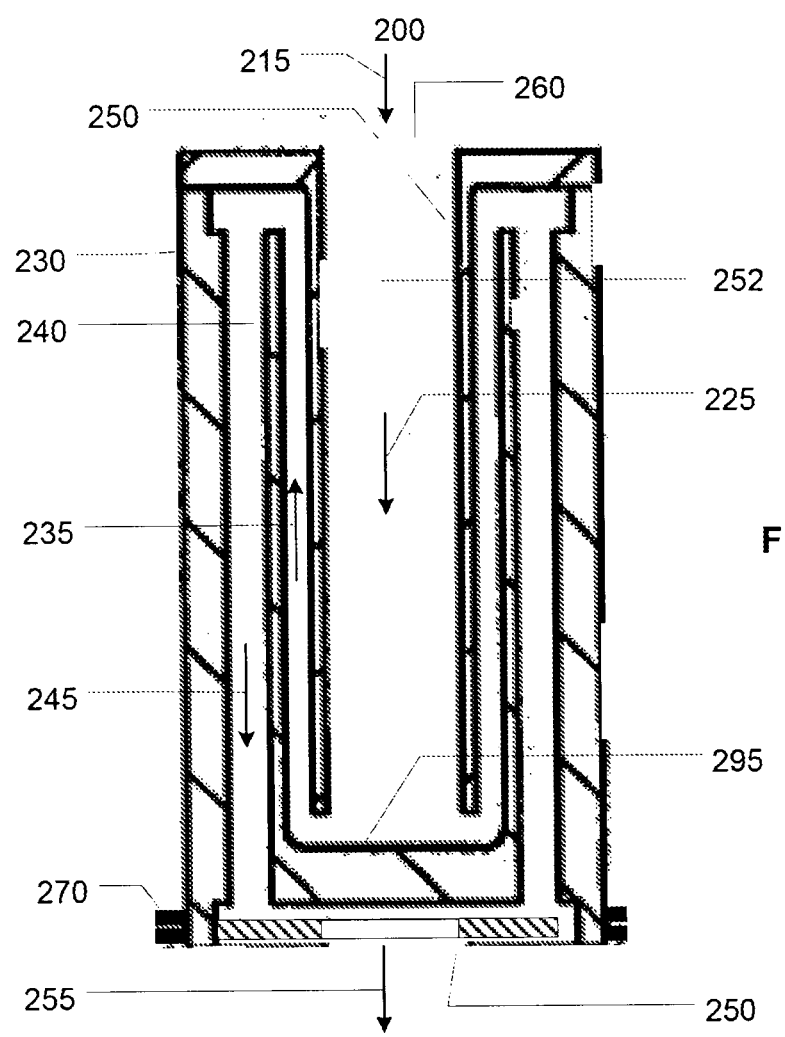
FIG. 2 is an enlarged view of the structure according to the embodiment illustrated in FIG. 1A.

Illustrated at FIG. 2 is an enlarged vertical sectional view of the metal structure 220. The metal structure may be generally cylindrical in shape. A base flange 270 is in good thermal contact with a vertical cylindrical wall 230 which is attached to an inner vertical cylindrical wall 250 and in good thermal contact with the cylindrical wall 250. A cup shaped cylinder wall 240 is also attached to the vertical cylindrical wall 230 by contact (not shown in this vertical sectional view). All elements of the metal structure 220, including the vertical walls 230, 240, and 250 and horizontal floor section 295 are in good thermal contact with each other allowing heat to flow easily by conduction from the outer wall 230 into inner walls 240 and 250. The walls 230, 240 and 250 may be cylindrical or tubular in nature and may be referred to as tubes or cylinders throughout this disclosure. As the gas flow enters metal structure 220 through an inlet opening 260, as indicated by arrow 215, the gas would first flow in a generally downward direction through an open space 252 in the tube 250 as indicated by arrow 225 then upwardly through the annular space between tubes 240 and 250 as indicated by arrow 235. The gas then flows in a downward direction between tubes 230 and 240 as indicated by arrow 245 before exiting the metal structure 220 through outlet 250 as indicated by arrow 255. The gas flow between vertical cylinders 230, 240, and 250 creates a tortuous flow path which greatly increases the surface area of contact between the heated metal tubes and the gas flowing along the walls of the tubes. As the gas flows through the metal structure 220, heat is transferred from the metal surfaces to the gas which aids in the vaporization of any suspended droplets remaining in the gas.

The vaporization apparatus illustrated in FIG. 1A and FIG. 1B may be used in a semiconductor device lab for fabricating integrated circuit device chips. For such applications, a preferred material of construction is stainless steel. Stainless steel is generally used because of its resistance to corrosion and ability to provide a contaminant free surface as preferred for the application. Stainless steel is thermally conductive, however, compared to other metals, stainless steel is a relatively poor thermal conductor. Table 1 shows the thermal conductivity of stainless steel in comparison to other metals. The flow of heat from the electric heater 120 to the tortuous flow passage will be slower when less thermally conductive materials are used, resulting in an increased response time of the vaporization apparatus.

TABLE 1

Thermal Conductivity of Metals

| Metal | Thermal Conductivity (W-m$^{-1}$K$^{-1}$) | Ratio to SS |
|---|---|---|
| Silver | 418 | 25.6 |
| Gold | 315 | 19.3 |
| Copper | 385 | 23 |
| Aluminum | 220 | 13 |
| Stainless Steel (304A SS) | 16.3 | 1.0 |

To improve or reduce the response time of the vaporization apparatus, a second electric heater 232 is provided. The second heater 232 may be located near the center of the vaporization apparatus 100. The flow of heat from the second electric heater 232 to all parts of the vaporization apparatus 100 located near the center of the vaporization apparatus 100 will be improved, thus reducing overall response time of the apparatus.

Figure 3A:
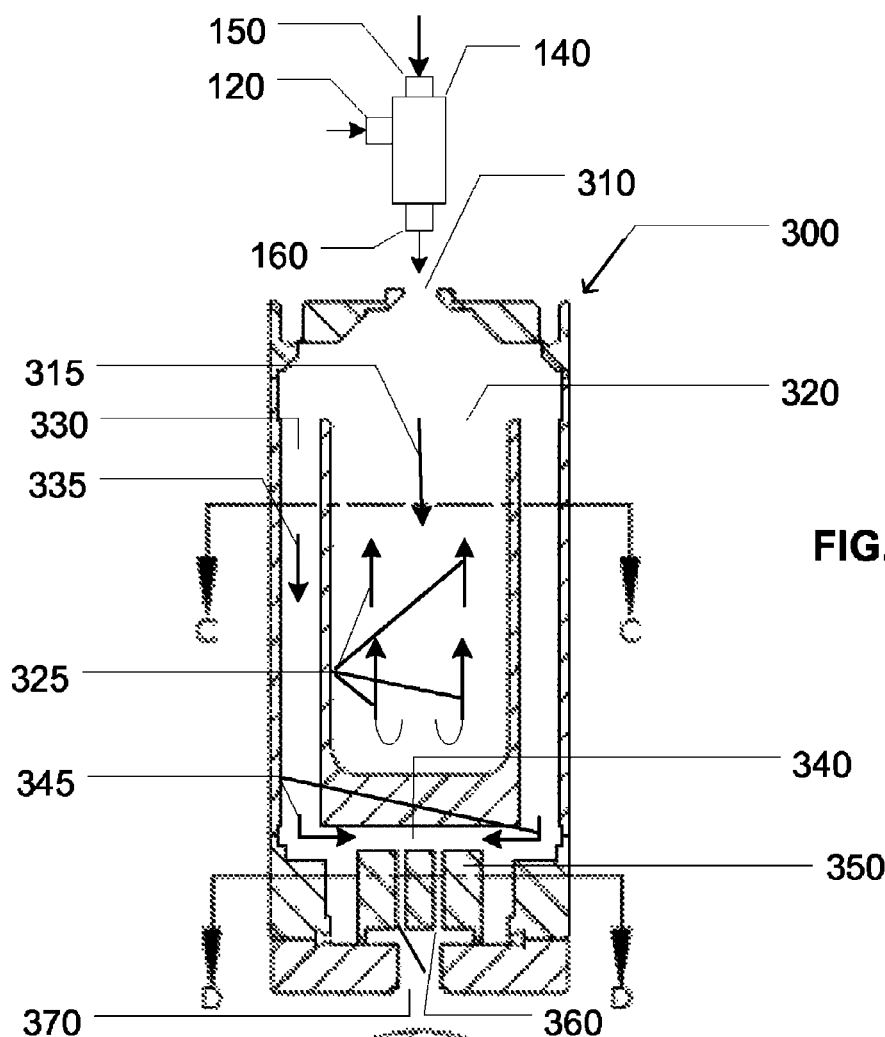
FIG. 3A is a sectional view of an embodiment of the vapor generation apparatus.
Figure 3B:
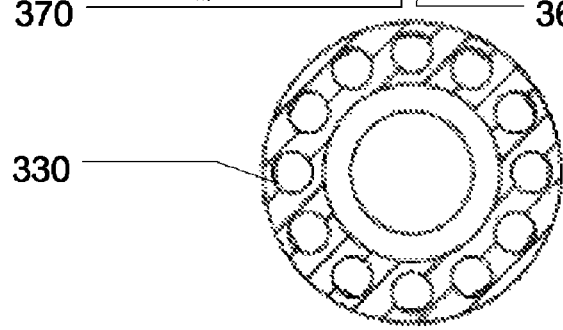
FIG. 3B is a sectional view of an embodiment of the vapor generation apparatus along the line C-C in FIG. 3A.
Figure 3C:
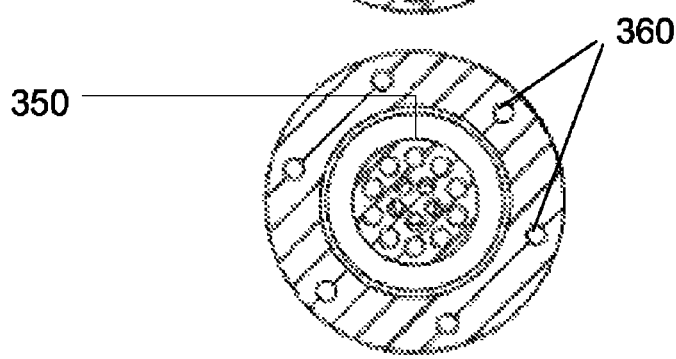
FIG. 3C is a sectional view of an embodiment of the vapor generation apparatus along the line D-D in FIG. 3A.

Illustrated in FIG. 3A is a vertical sectional view of an additional embodiment 300 of the metal heat exchanger for heating and vaporizing the droplet aerosol. The heat exchanger is heated by an electric heater (not shown) similar to electric heater 120 illustrated in FIG. 1A. The droplet aerosol enters the heat exchanger through inlet hole 310 into empty space 320 in the direction of downward arrow 315. The droplet aerosol flow then undergoes a change in flow direction and flows upward as depicted by group of arrows 325. This droplet aerosol then flows into tubular flow passageways, one of which is identified at 330 in FIG. 3B, along the direction of arrows 345. The droplet aerosol then flows through the multitude of tubular flow passageways for heating the gas and vaporizing the droplets contained therein.

At high gas and liquid flow rates, the gas flowing out of flow passageways 330 of the primary heat exchanger may still contain un-vaporized droplets suspended in the gas. This droplet aerosol then flows into space 340 and subsequently through secondary heat exchanger 350. The aerosol then flows through gas flow passageways 360 in the secondary heat exchanger in order to vaporize the remaining un-vaporized droplets suspended in the gas. The gas and vapor mixture then flows out of the secondary heat exchanger through exit 370.

Although the present disclosure has been described with reference to preferred embodiments, workers skilled in the art will recognize that changes may be made in form and detail without departing from the spirit and scope of the disclosure.

The invention claimed is:

1. An apparatus for vaporizing a liquid to form a vapor, the apparatus comprising:
   a housing;
   a primary heat exchanger within the housing and having an inlet for a gas carrying suspended liquid droplets to enter and an outlet for a gas/vapor mixture to flow out of the primary heat exchanger, the primary heat exchanger comprising a multitude of tubular flow passageways configured to heat the gas and vaporize liquid droplets in the gas to produce a gas and vapor mixture;
   a secondary heat exchanger within the housing and in sequential fluid communication with the primary heat exchanger and the secondary heat exchanger comprising a multitude of tubular flow passageways configured to further vaporize liquid droplets remaining in the gas after passing through the primary heat exchanger;
   wherein the tubular flow passageways in either the primary heat exchanger or the secondary heat exchanger direct the gas/vapor mixture along a tortuous flow path wherein the flow path through the primary heat exchanger comprises at least one change in a direction of flow between the inlet and outlet of the primary heat exchanger and the flow path through the secondary heat exchanger comprises at least one more change in a direction of flow between the inlet and outlet of the secondary heat exchanger than the primary heat exchanger; and
   wherein the secondary heat exchanger is vertically offset from the primary heat exchanger such that the tubular flow passageways of the primary and secondary heat exchangers provide a continuous flow path through the housing wherein the tubular passageways of said primary and secondary heat exchangers are substantially parallel but the tubular passageways of said primary and secondary heat exchangers are vertically offset from one another.

2. The apparatus of claim 1, wherein both the primary and the secondary heat exchanger direct the gas/vapor mixture along a tortuous flow path with the at least one change in direction of flow.

3. The apparatus of claim 1, wherein the tubular gas flow passageways of the primary and the secondary heat exchangers are cylindrical in shape and substantially parallel to one other.

4. The apparatus of claim 3, wherein longitudinal axes of the tubular gas flow passageways of the primary and secondary heat exchangers are arranged in a circular pattern around a central axis of the housing.

5. The apparatus of claim 1 further comprising an outer electric heater configured to supply heat for vaporization.

6. The apparatus of claim 1 further comprising an inner electric heater configured to supply additional heat for vaporization.

7. The apparatus of claim 6, wherein the inner electric heater is disposed approximately in the center of the housing.

8. A method for vaporizing a liquid to form vapor, the method comprising:
   introducing a gas and liquid droplet mixture flow into a metal housing comprising a plurality of flow passageways configured to heat the gas and liquid droplet mixture flow and directing the gas and liquid droplet mixture through an inlet of the metal housing and flowing the gas in a first direction through a first flow passageway within the housing;
   directing the gas flow in a second direction, the second direction being generally opposite to the first direction, through a second annular flow path;
   directing the gas flow in a third direction, the third direction being substantially that of the first direction and generally opposite the second direction, through a third annular flow passageway;
   directing the gas flow in a fourth direction, the fourth direction being generally opposite to the third direction, through a fourth annular flow passageway;
   directing the gas flow in a fifth direction, the fifth direction being generally opposite to the fourth direction, through a fifth annular flow passageway to further vaporize any liquid droplets remaining in the gas; and
   flowing the gas to an outlet of the metal housing.

9. The method of claim 8, wherein the flow passageways comprise a plurality of metal tubes being in thermal contact with the metal housing and further comprising the step of heating the metal housing with a first heater and the plurality of tubes with the heater in thermal contact with the housing to vaporize liquid droplets in the gas.

10. The method of claim 9, wherein a second heater disposed within the metal housing is in good thermal contact with the metal housing and the plurality of metal tubes providing heat to the flow passageways.

11. The method of claim 8, and further directing the gas to a second metal housing in fluid connection with the first metal housing and having substantially the same construction as the first metal housing and flowing the gas and liquid droplet mixture through a second plurality of flow passageways in substantially the same manner as the first plurality of flow passageways to further vaporize any liquid droplets remaining in the gas.

12. The method of claim 11, wherein the flow passageways of the second metal housing comprise a plurality of metal tubes being in thermal contact with the second metal housing and further comprising the step of heating the second metal housing and the plurality of tubes with a heater in thermal contact with both the first and second housings to vaporize liquid droplets in the gas.

13. The method of claim 12, wherein the tubular gas and liquid droplet mixture flow passageways of the first and second metal housings are each cylindrical in shape and substantially parallel to one other within the respective housing.

14. The method of claim 12, wherein longitudinal axes of the tubular gas flow passageways of the first and second metal housing are each arranged in a circular pattern around a central axis.

15. The method of claim 9, wherein the step of heating further comprises heating the gas in the metal housings with a second inner electric heater and wherein the first heater comprises an outer electric heater providing sufficient heat for vaporization.

* * * * *